(12) United States Patent
Yamazoe

(10) Patent No.: US 7,586,626 B2
(45) Date of Patent: Sep. 8, 2009

(54) MEASUREMENT METHOD, EXPOSURE METHOD, EXPOSURE APPARATUS, AND DEVICE FABRICATION METHOD

(75) Inventor: Kenji Yamazoe, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 115 days.

(21) Appl. No.: 11/971,506

(22) Filed: Jan. 9, 2008

(65) Prior Publication Data
US 2008/0170240 A1 Jul. 17, 2008

(30) Foreign Application Priority Data
Jan. 12, 2007 (JP) .............................. 2007-005084

(51) Int. Cl.
*G01B 11/14* (2006.01)
(52) U.S. Cl. .......................... 356/620; 356/400; 355/53
(58) Field of Classification Search ......... 356/614–623, 356/399–401; 355/53, 72, 75
See application file for complete search history.

(56) References Cited

U.S. PATENT DOCUMENTS
6,160,612 A * 12/2000 Itoh et al. ..................... 355/53

6,803,554 B2 10/2004 Ye et al.
2008/0212056 A1 * 9/2008 Shiraishi ....................... 355/53

FOREIGN PATENT DOCUMENTS
JP 2002-014005 1/2002

* cited by examiner

*Primary Examiner*—Hoa Q Pham
(74) *Attorney, Agent, or Firm*—Rossi, Kimms & McDowell, LLP

(57) ABSTRACT

A method for measuring a synchronization error between a first stage and a second stage in a scanning exposure apparatus including the first stage which supports a reticle, the second stage which supports a substrate, and a projection optical system which projects a pattern of the reticle onto the substrate, the method comprises the steps of measuring, using a measurement unit, a light intensity distribution formed by a measurement pattern while synchronously scanning a measurement mask which has the measurement pattern and is arranged on the first stage, and the measurement unit arranged on the second stage, and calculating the synchronization error between the first stage and the second stage based on a time change in the light intensity distribution measured in the measuring step.

12 Claims, 16 Drawing Sheets

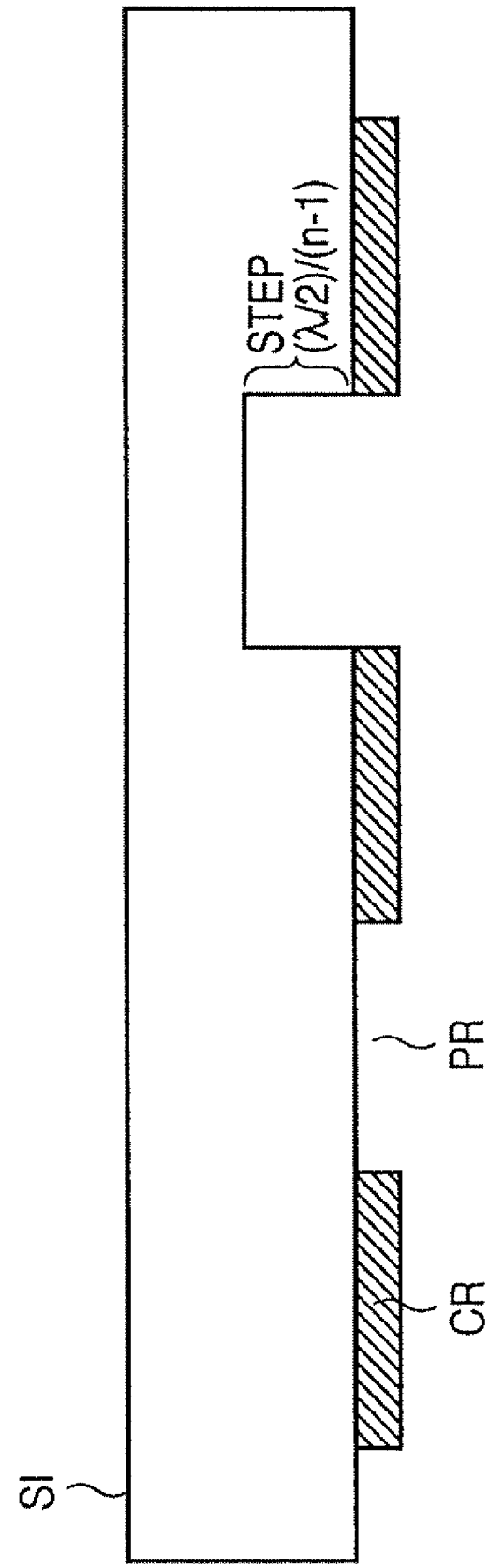

F I G. 14
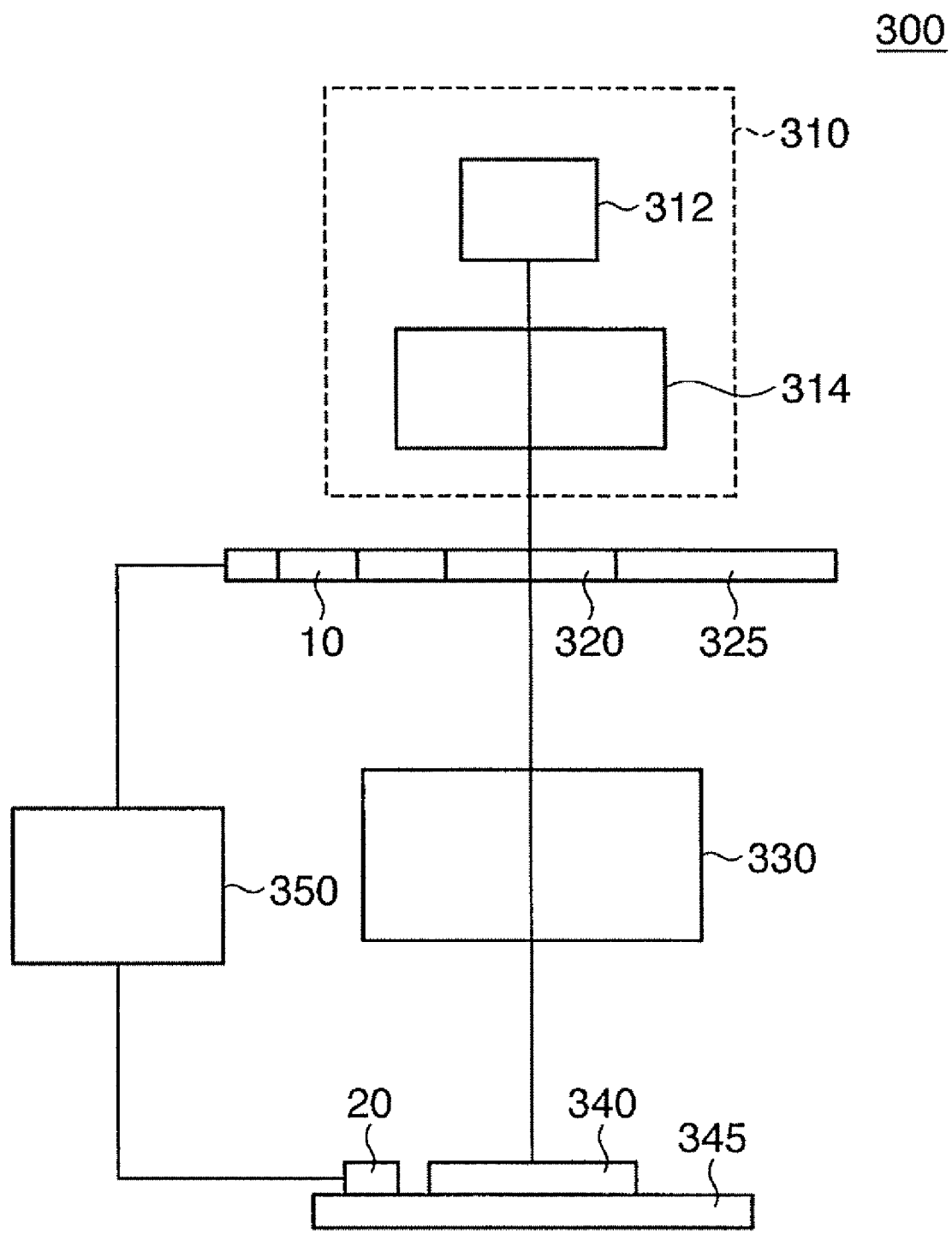

MEASUREMENT METHOD, EXPOSURE METHOD, EXPOSURE APPARATUS, AND DEVICE FABRICATION METHOD

BACKGROUND OF THE INVENTION

1. Field of the Invention

The present invention relates to a measurement method, an exposure method, an exposure apparatus, and a device fabrication method.

2. Description of the Related Art

A projection exposure apparatus has conventionally been employed to fabricate fine semiconductor devices such as a semiconductor memory and logic circuit using photolithography. The projection exposure apparatus projects and transfers a circuit pattern drawn on a reticle (mask) onto, for example, a wafer via a projection optical system. Along with the recent demand for micropatterning semiconductor devices, the projection exposure apparatus is desired to transfer a pattern having a size half the exposure wavelength or less by exposure, and to further improve the resolution (i.e., attain a higher resolution).

The exposure apparatus generally achieves a higher resolution by shortening the exposure wavelength and increasing the numerical aperture (NA) of the projection optical system (attaining a high-NA projection optical system). However, only shortening the exposure wavelength and attaining a high-NA projection optical system are insufficient to achieve a high-resolution exposure apparatus. It is also necessary to improve the performance of the exposure apparatus itself. For example, some recent projection optical systems have achieved remarkable improvements in regard to aberrations. Also, some recent illumination optical systems have achieved polarized illumination in place of the conventional non-polarized illumination. The polarized illumination here means an illumination method of controlling the polarization state of illumination light in accordance with the pattern of a reticle.

To maintain high performance, the exposure apparatus comprises a measurement unit for measuring various optical characteristics, and a correction unit for correcting the optical characteristics on the basis of the measurement result obtained by the measurement unit. For example, there is proposed an exposure apparatus which can measure and correct the aberration of a projection optical system. Examples of measurable optical characteristics are the NA of the projection optical system, the polarization state of illumination light, the curvature of field, the exposure dose, the exposure dose uniformity, the illumination light distribution, and the Jones matrix of the projection optical system, in addition to the aberration of the projection optical system.

Exposure apparatuses are roughly classified into two types that is, an exposure apparatus (stepper) of a step-and-repeat scheme and an exposure apparatus (scanner) of a step-and-scan scheme. The scanner is an exposure apparatus which supports the recent increase in resolution because it is more amenable to increases in the NA than the stepper.

The scanner scans a reticle and wafer to transfer the pattern of the reticle onto the wafer. If the movement of the reticle (reticle stage) is not correctly synchronized with that of the wafer (wafer stage) during scanning, the imaging position shifts from a desired one, resulting in deterioration in an aerial image due to image blurring; that is, distortion (scan distortion) occurs during scanning. The scan distortion is a factor of deterioration in the aerial image, which never occurs in the stepper. Because the scan distortion has little influence on the aerial image, it has not been problematic up to now. However, along with recent increases in the performance of exposure apparatuses, the scan distortion is becoming nonnegligible.

To cope with this situation, attempts have been made to measure and correct the scan distortion. For example, the distortion can be measured by exposing a resist to measure the positional shift of the light intensity distribution. U.S. Pat. No. 6,803,554 proposes a technique of forming minute pinholes in a light intensity sensor such as a CCD (Charge Coupled Device) in a grid pattern to measure the light intensity distribution on a wafer surface. Japanese Patent Laid-Open No. 2002-14005 proposes a technique of inserting a minute slit and light intensity sensor on the image plane of a projection optical system to measure the light intensity distribution on a wafer surface.

Unfortunately, measurement of the distortion (scan distortion) that occurs during scanning using prior art presents great difficulty. For example, the distortion measured by exposing the resist is the accumulated scan distortion. It is therefore impossible to measure the degree of distortion which has occurred at a certain time during scanning. U.S. Pat. No. 6,803,554 and Japanese Patent Laid-Open No. 2002-14005 disclose no method of measuring the shift of the imaging position during scanning. In other words, U.S. Pat. No. 6,803,554 and Japanese Patent Laid-Open No. 2002-14005 merely measure the accumulated light intensity distribution after completing scanning exposure, or a light intensity distribution after stationary exposure.

SUMMARY OF THE INVENTION

The present invention provides a measurement method which can accurately measure any synchronization error between a first stage which supports a reticle and a second stage which supports a substrate in a scanning exposure apparatus.

According to one aspect of the present invention, there is provided a method for measuring a synchronization error between a first stage and a second stage in a scanning exposure apparatus including the first stage which supports a reticle, the second stage which supports a substrate, and a projection optical system which projects a pattern of the reticle onto the substrate, the method comprises the steps of measuring, using a measurement unit, a light intensity distribution formed by a measurement pattern while synchronously scanning a measurement mask which has the measurement pattern and is arranged on the first stage, and the measurement unit arranged on the second stage; and calculating the synchronization error between the first stage and the second stage based on a time change in the light intensity distribution measured in the measuring step.

According to another aspect of the present invention, there is provided an exposure method for projecting a pattern of a reticle onto a substrate while scanning a first stage which supports the reticle and a second stage which supports the substrate, the method comprises the steps of measuring the synchronization error using the above measurement method, correcting the measured synchronization error; and projecting the pattern of the reticle onto the substrate while scanning the first stage and the second stage having undergone the correction of the synchronization error.

According to still another aspect of the present invention, there is provided a device fabrication method comprising the steps of exposing a substrate using the above exposure method, and performing a development process for the exposed substrate.

According to yet another aspect of the present invention, there is provided a scanning exposure apparatus including a first stage which supports a reticle, a second stage which supports a substrate, and a projection optical system which projects a pattern of the reticle onto the substrate, the apparatus comprises a measurement mask which is arranged on the first stage and has a measurement pattern, a measurement unit which is arranged on the second stage and configured to measure a light intensity distribution formed by the measurement pattern, while being scanned in synchronism with the measurement pattern, and a control unit configured to calculate a synchronization error between the first stage and the second stage based on a time change in the light intensity distribution measured by the measurement unit.

Further features of the present invention will become apparent from the following description of exemplary embodiments with reference to the attached drawings.

BRIEF DESCRIPTION OF THE DRAWINGS

FIG. 10 is a schematic sectional view of a general phase shift mask (phase shifting mask).

FIG. 14 is a schematic sectional view of an exposure apparatus according to one aspect of the present invention.

DESCRIPTION OF THE EMBODIMENTS

Figure 1:
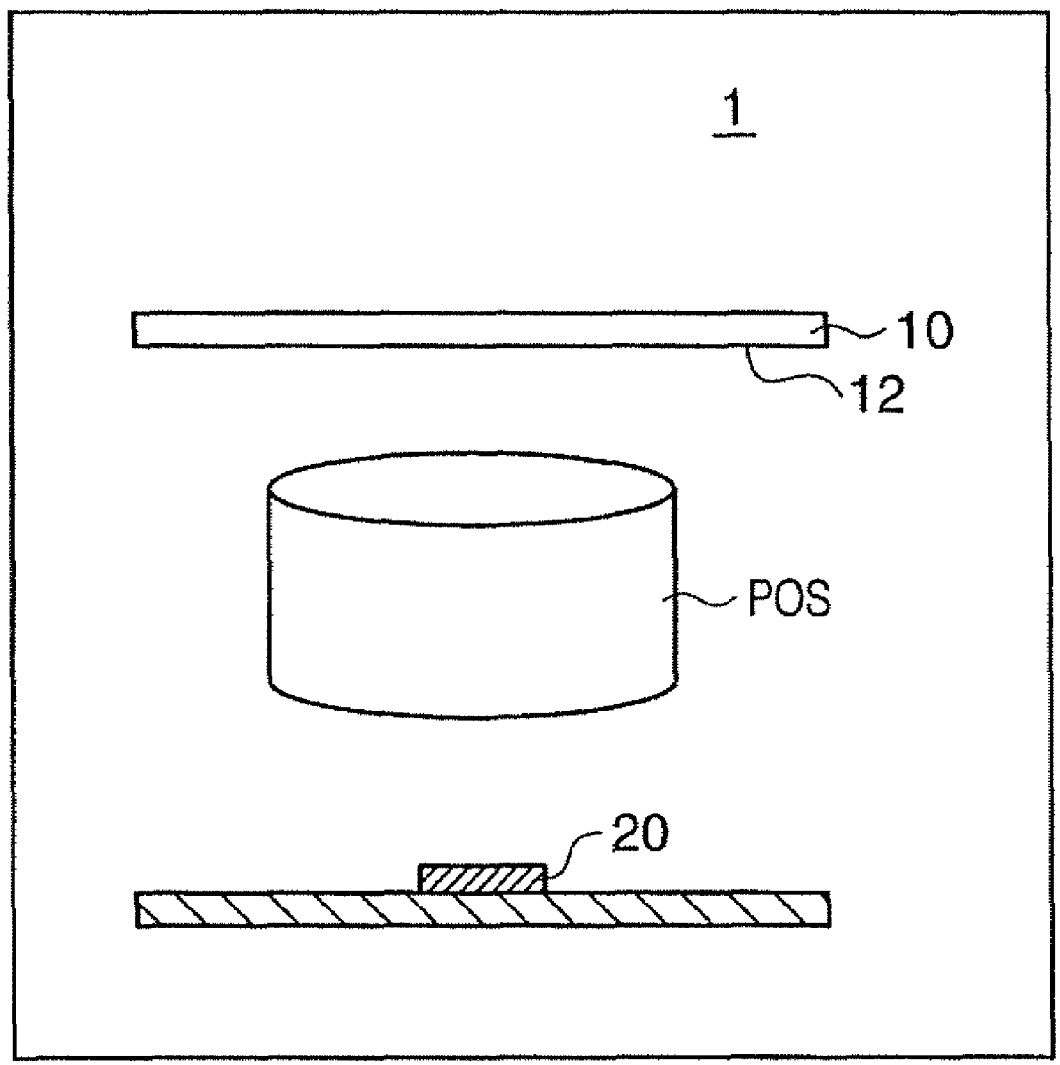
FIG. 1 is a schematic view of a measurement apparatus to execute a measurement method according to one aspect of the present invention.

Preferred embodiments of the present invention will be described below with reference to the accompanying drawings. Note that the same reference numerals denote the same members throughout the drawings, and a repetitive description thereof will be omitted.

The principle of a measurement method according to this embodiment will be explained first. The measurement method measures any synchronization error between a reticle stage (first stage) and a wafer stage (second stage) in an exposure apparatus of a step-and-scan scheme (scanning type). In other words, the measurement apparatus measures scan distortion which occurs while scanning a reticle supported by the reticle stage and a wafer supported by the wafer stage.

FIG. 1 is a schematic view for explaining a measurement method according to this embodiment, which shows the arrangement of a measurement apparatus 1 for executing the measurement method. As shown in FIG. 1, the measurement apparatus 1 includes a measurement mask 10 and measurement unit 20. Let $\lambda$ be the exposure wavelength of an exposure apparatus, and NA be the image-side numerical aperture of a projection optical system. Also, let $\sigma$ be the ratio between the object-side numerical aperture of the projection optical system and a numerical aperture formed by a light beam which strikes a reticle via an illumination optical system. It is possible to change the $\sigma$ value by selecting various members to constitute the illumination optical system. Note that a general exposure apparatus takes a maximum $\sigma$ value smaller than one. Since the exposure apparatus can take various values of the image-side numerical aperture NA of the projection optical system and the exposure wavelength $\lambda$, it is convenient to normalize the pattern sizes (e.g., the periods) of the measurement mask 10 and measurement unit 20 by ($\lambda$/NA). For example, if the exposure wavelength $\lambda$ is 248 nm and the image-side numerical aperture NA of the projection optical system is 0.73, the pattern size is normalized to 0.29 by ($\lambda$/NA) for 100 nm.

The measurement mask 10 is used to measure scan distortion and arranged on the reticle stage of the exposure apparatus. The measurement mask 10 includes a measurement pattern 12 on the side of a projection optical system POS. The measurement pattern 12 is a specific pattern for scan distortion measurement and will be explained in detail later.

The measurement unit 20 is arranged on the wafer stage of the exposure apparatus, and measures a light beam which is diffracted by the measurement pattern 12 and converged (imaged) on the image plane (wafer surface) via the projection optical system POS. More specifically, the measurement unit 20 measures a light intensity distribution formed by the measurement pattern 12 of the measurement mask 10. The arrangement of the measurement unit 20 will be explained in detail later.

In the measurement method according to this embodiment, first, the measurement unit 20 measures a light intensity distribution formed by the measurement pattern 12, while synchronously scanning the measurement unit 20 arranged on the wafer stage and the measurement mask 10 which has the measurement pattern 12 and is arranged on the reticle stage. Next, the light intensity distribution measured by the measurement unit 20 is analyzed so as to measure scan distortion. More specifically, the synchronization error between the reticle stage and the wafer stage is calculated based on a time change (temporal change) in light intensity distribution.

Figure 2:
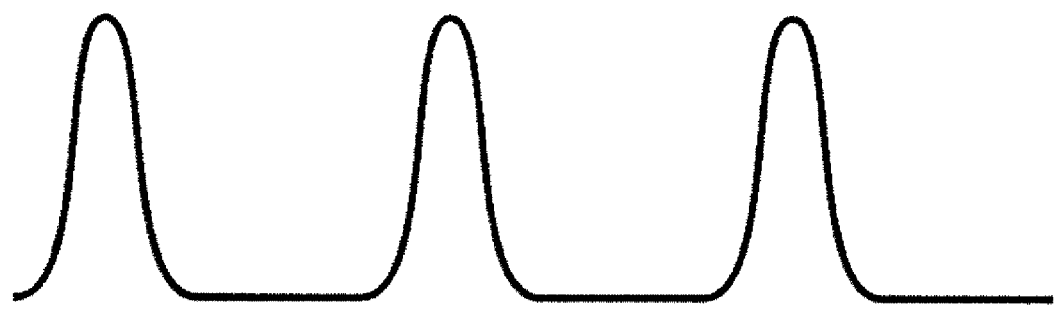
FIG. 2 is a chart showing an example of a light intensity distribution formed by the measurement pattern of a measurement mask shown in FIG. 1.

The measurement mask 10 and measurement unit 20 will now be explained in detail. An example of the measurement pattern 12 of the measurement mask 10 is a Line and Space (L&S) pattern which forms a light intensity distribution (aerial image) as shown in FIG. 2. However, the measurement pattern 12 is not particularly limited to the L&S pattern, and includes various patterns such as a contact hole pattern, as will be described later. Note that FIG. 2 is a chart showing an example of a light intensity distribution formed by the measurement pattern 12 of the measurement mask 10.

Figure 3:
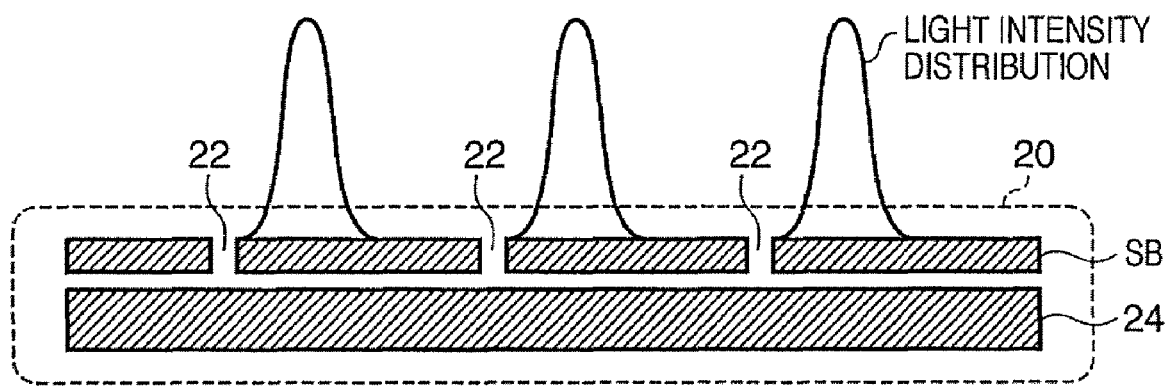
FIG. 3 is a schematic sectional view of a measurement unit shown in FIG. 1.

As shown in FIG. 3, the measurement unit 20 includes a light-shielding board SB in which openings 22 are formed, and a light intensity sensor 24 for receiving light components having passed through the openings 22. The openings 22 are formed as, for example, minute slits or pinholes in correspondence with the shape of the measurement pattern 12 of the measurement mask 10. The measurement unit 20 is arranged such that each opening 22 is located near a corresponding position at which the light intensity is zero in a light intensity distribution formed by the measurement pattern 12 while the measurement mask 10 is at rest. Also referring to FIG. 3, each opening 22 is located only on the left side with respect to a corresponding position at which the light intensity takes a maximum value in a light intensity distribution formed by the measurement pattern 12 while the measurement mask 10 is at rest. The light intensity sensor 24 includes, for example, a photoelectric conversion device such as a photodetector. The photodetector here refers to a device which detects light energy by utilizing a photoelectric effect (e.g., the photovoltaic effect, photoconductivity effect, or photoemissive effect) of converting photons into electrons. The photodetector exhibits a higher response speed than CCDs. FIG. 3 is a schematic sectional view showing the arrangement of the measurement unit 20. The photodetector preferably exhibits a sufficiently high response speed. More specifically, the rise time is preferably 0.1 µs or less.

If a light intensity distribution (aerial image) formed by the measurement pattern 12 while scanning the measurement mask 10 and measurement unit 20 does not shift, the light intensity measured by the measurement unit 20 is zero. In contrast, if the overall light intensity distribution shifts to the left as a synchronization error (scan distortion) between the wafer stage and the reticle stage occurs, the light intensity measured by the measurement unit 20 takes a certain value. When the shape of a light intensity distribution formed by the measurement pattern 12 is known in advance, the shift amount (shifted distance) of the light intensity distribution can be associated with the light intensity measured by the measurement unit 20. This makes it possible to measure the scan distortion. If the overall light intensity distribution shifts to the right, the measurement unit 20 is arranged such that each opening 22 is located at a corresponding position at which the light intensity is zero and which lies on the right side with respect to a corresponding position at which the light intensity takes a maximum value in a light intensity distribution formed by the measurement pattern 12 while the measurement mask 10 is at rest.

Letting t be the time from when the measurement mask 10 and measurement unit 20 start being scanned, the output from the measurement unit 20 can be expressed as a function of the time t. Let I(t) be the output from the measurement unit 20 here. Analyzing the output I(t) from the measurement unit 20 makes it possible to measure the positional shift of the light intensity distribution at a certain time during scanning.

Letting (x, y) be the coordinate position of a wafer surface, the prior art measures a light intensity distribution I(x, y) by changing the x-coordinate or y-coordinate. For example, assume exposure is performed while the measurement mask 10 is at rest. A certain light intensity distribution is formed by exposure while the measurement mask 10 is at rest. To observe this light intensity distribution, the prior art must derive the light intensity distribution I(x, y) by moving the measurement unit 20 on the wafer surface while the measurement mask 10 is at rest. In the prior art, therefore, the measurement unit 20 moves when seen from a certain position on the measurement mask 10 via the projection optical system POS. In other words, the position of the measurement unit 20 moves relative to the measurement mask 10.

In the measurement apparatus 1 and measurement method according to this embodiment, the measurement mask 10 and measurement unit 20 move in synchronism with each other. The measurement unit 20 is nearly at rest when seen from a certain position on the measurement mask 10 via the projection optical system POS. In other words, the position of the measurement unit 20 does not move relative to the measurement mask 10. That is, during the scanning of the measurement mask 10 and measurement unit 20, a given point on the measurement mask 10 (measurement pattern 12) is nearly, optically conjugate to a corresponding point on the measurement unit 20 via the projection optical system POS. However, the synchronization between the reticle stage and the wafer stage is not perfect, so a considerable synchronization error occurs. For this reason, a given point on the measurement mask 10 is not completely conjugate to a corresponding point on the measurement unit 20. In other words, the position of the measurement unit 20 is not completely constant relative to the measurement mask 10. Note, however, that it is an object of this embodiment to measure scan distortion, which includes the synchronization error between the reticle stage and the wafer stage, and the aberration of the optical system. For this reason, during the scanning of the measurement mask 10 and measurement unit 20, a given point on the measurement mask 10 need only be optically conjugate to a corresponding point on the measurement unit 20 to a degree attainable by the exposure apparatus.

In this manner, the measurement apparatus 1 and measurement method according to this embodiment can express the light intensity distribution at a certain position on the measurement mask 10 (measurement pattern 12) as the function I(t) of the time. That is, the prior art measures a light intensity distribution based on the position of the measurement unit 20, whereas this embodiment measures a light intensity distribution as a time change at a certain position. In other words, the difference between the prior art and this embodiment is whether the position of the measurement unit 20 moves relative to the measurement mask 10.

The measurement apparatus 1 and measurement method according to the first and second embodiments of the present invention will be described below.

First Embodiment

Figure 4A:
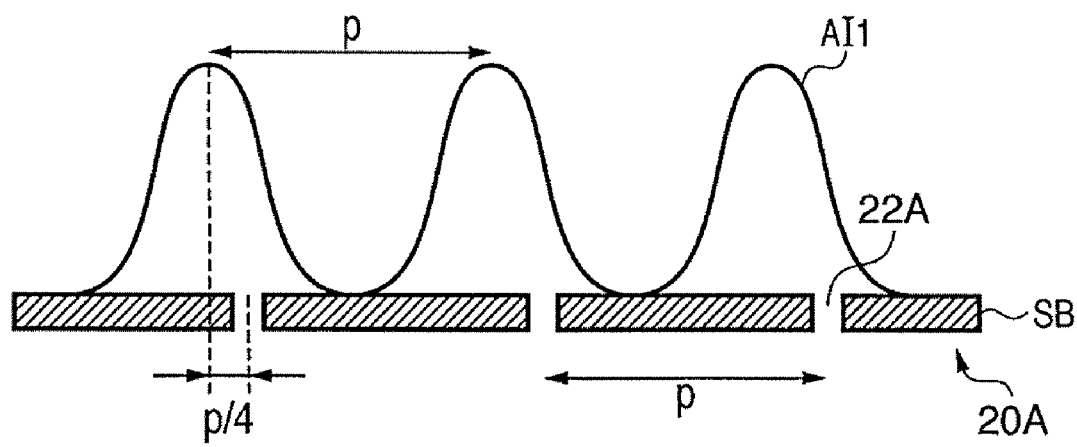
FIGS. 4A and 4B are charts each showing the relationship between a light intensity distribution formed by the measurement pattern of a measurement mask and an opening of a measurement unit.
Figure 4B:
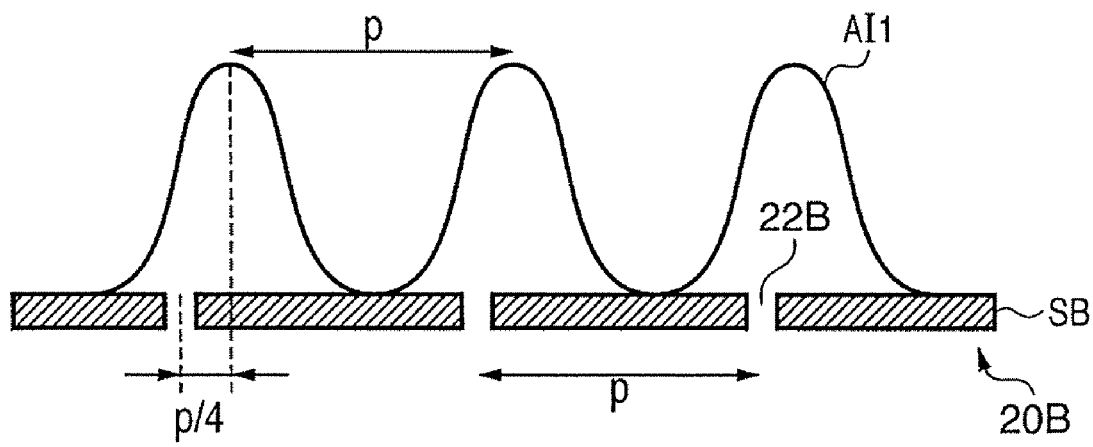

In the first embodiment, an L&S pattern (periodic pattern) is used as a measurement pattern 12 of a measurement mask 10. The measurement pattern 12 of the measurement mask 10 is an L&S pattern (periodic pattern) with a period p and forms a light intensity distribution (aerial image) AI1 with the period p, as shown in FIGS. 4A and 4B. Two measurement units 20 are arranged for the light intensity distribution AI1 formed by the measurement pattern 12. The measurement units 20 each include a light-shielding board SB having openings 22 with the period p formed as minute slits, and a light intensity sensor 24 which includes a photodetector and is arranged under the openings 22. The two measurement units 20 will be referred to as a first measurement unit 20A and second measurement unit 20B hereinafter. Note that FIG. 4A is a chart showing the positional relationship between a light intensity distribution formed by the measurement pattern 12 of the measurement mask 10 and an opening 22A of the first measurement unit 20A. FIG. 4B is a chart showing the positional relationship between a light intensity distribution formed by the measurement pattern 12 of the measurement mask 10 and an opening 22B of the second measurement unit 20B.

As shown in FIG. 4A, the first measurement unit 20A is arranged such that the opening 22A is located at a position shifted to the right by p/4 from a position at which the light intensity takes a maximum value in the light intensity distribution AI1 formed by the measurement pattern 12 during stationary exposure. As shown in FIG. 4B, the second measurement unit 20B is arranged such that the opening 22B is located at a position shifted to the left by p/4 from a position at which the light intensity takes a maximum value in the light intensity distribution AI1 formed by the measurement pattern 12 during stationary exposure. The widths of the openings 22A and 22B of the first measurement unit 20A and second measurement unit 20B are preferably p/4 or less. In the first measurement unit 20A and second measurement unit 20B, the openings 22A and 22B are parallel to the measurement pattern 12 of the measurement mask 10, and the repetition directions of the openings 22A and 22B are the same as that of the measurement pattern 12.

In the first embodiment, since p/2 is normalized into a value less than 0.5 by ($\lambda$/NA), the light intensity distribution can be approximated by two-beam interference. The light intensity distribution AI1 on the image plane (i.e., the measurement unit 20) in two-beam interference can be approximated by a sine curve. The slope of the sine curve becomes maximum at a position shifted by ¼ the period from a position at which the light intensity takes a maximum value. Hence, the first measurement unit 20A and second measurement unit 20B are sensitive to a change in light intensity in response to a positional shift.

Consider a case in which the absolute value of the shift amount of the light intensity distribution AI1 is p/4 or less. If the light intensity distribution AI1 shifts to the right, the light intensity measured by the first measurement unit 20A increases while that measured by the second measurement unit 20B decreases. If the light intensity distribution AI1 shifts to the left, the light intensity measured by the first measurement unit 20A decreases while that measured by the second measurement unit 20B increases. Analyzing such a characteristic makes it possible to measure a synchronization error (a direction and amount of the synchronization shift) between a reticle stage and a wafer stage during scanning. Since the analysis of time changes in the light intensities measured by the first measurement unit 20A and second measurement unit 20B is the same as in a case in which two measurement masks and three measurement units 20 (to be described later) are used, a detailed description thereof will be omitted here.

To accurately measure the synchronization error (scan distortion) between the reticle stage and the wafer stage during scanning, it is necessary to perform alignment calibration between the measurement mask 10 and the measurement unit 20. Since the measurement mask 10 and measurement unit 20 are originally fabricated with sufficient accuracies, it is necessary to improve the alignment accuracy and the accuracy of scan distortion computed from the light intensity measured by the measurement unit 20. Alignment calibration using the first measurement unit 20A and second measurement unit 20B will now be explained. For the alignment calibration, the light intensity distribution AI1 of the measurement pattern 12 is formed while the measurement mask 10 is at rest. The first measurement unit 20A and second measurement unit 20B are then aligned such that the light intensities measured by them become equal to each other. To calibrate the relationship between the measured light intensity and the shift amount of the light intensity distribution AI1, the relationship between the position and the light intensity is acquired by moving the first measurement unit 20A and second measurement unit 20B from at least −p/2 to p/2 during stationary exposure.

The measurement of the synchronization error (scan distortion) between the reticle stage and the wafer stage using two measurement masks 10 and three measurement units 20 will be explained. In the following description, the two measurement masks 10 will be referred to as a first measurement mask 10A and second measurement mask 10B, and the three measurement units 20 will be referred to as a first measurement unit 20C, second measurement unit 20D, and third measurement unit 20E.

Figure 5A:
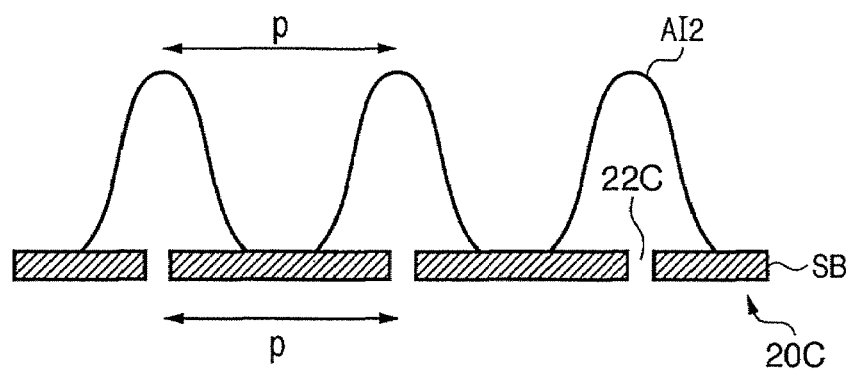
FIGS. 5A to 5C are charts each showing the relationship between a light intensity distribution formed by the measurement pattern of a measurement mask and an opening of a measurement unit.
Figure 5B:
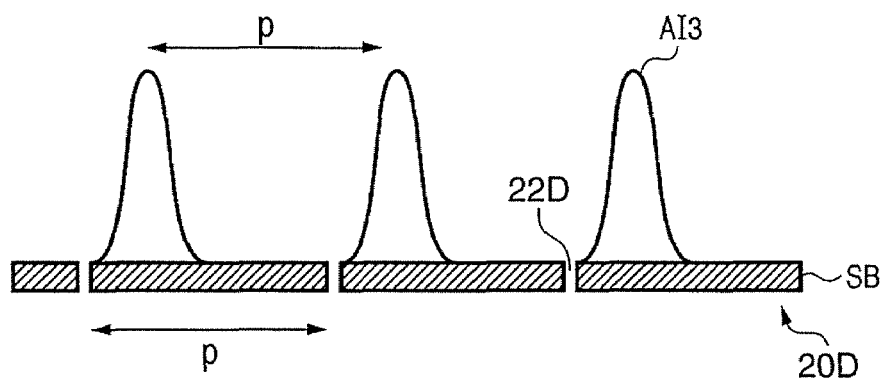
Figure 5C:
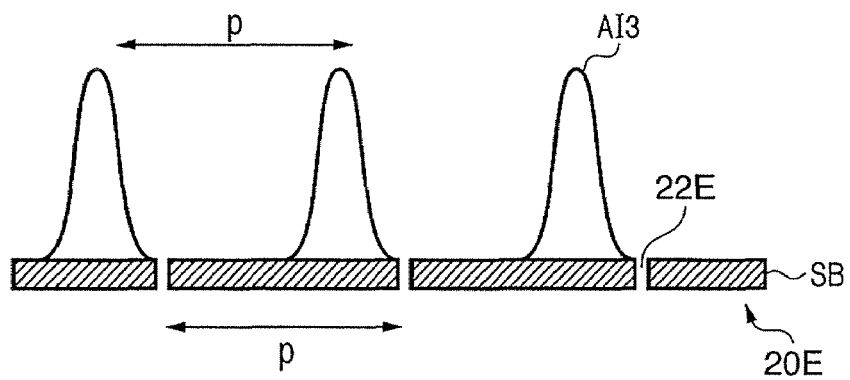

A measurement pattern 12A of the first measurement mask 10A is an L&S pattern (periodic pattern) with a period p and forms a light intensity distribution AI2 having a sinusoidal waveform with the period p, as shown in FIG. 5A. A measurement pattern 12B of the second measurement mask 10B is an L&S pattern with the period p, and forms a light intensity distribution AI3 in which the light intensity becomes nearly zero at p/2, as shown in FIG. 5B or 5C. FIG. 5A is a chart showing the positional relationship between the light intensity distribution AI2 formed by the measurement pattern 12A of the first measurement mask 10A and an opening 22C of the first measurement unit 20C. FIG. 5B is a chart showing the positional relationship between the light intensity distribution AI3 formed by the measurement pattern 12B of the second measurement mask 10B and an opening 22D of the second measurement unit 20D. FIG. 5C is a chart showing the positional relationship between the light intensity distribution AI3 formed by the measurement pattern 12B of the second measurement mask 10B and an opening 22E of the third measurement unit 20E.

The first measurement unit 20C to third measurement unit 20E include light-shielding boards SB having the openings 22C to 22E with the period p formed as minute slits, and light intensity sensors 24 which include photodetectors and are arranged under the openings 22C to 22E. The widths of the openings 22C to 22E are preferably p/4 or less. In the first measurement unit 20C, the opening 22C is parallel to the measurement pattern 12A of the first measurement mask 10A, and the repetition direction of the opening 22C is the same as that of the measurement pattern 12A. Similarly, in the second measurement units 20D and 20E, the openings 22D and 22E are parallel to the measurement pattern 12B of the second measurement mask 10B, and the repetition directions of the openings 22D and 22E are the same as that of the measurement pattern 12B.

The first measurement unit 20C is arranged such that the opening 22C is located at a position at which the light intensity takes a maximum value in the light intensity distribution AI2 formed by the measurement pattern 12A during stationary exposure, as shown in FIG. 5A. The second measurement unit 20D is arranged such that the opening 22D is located at a position at which the light intensity is nearly zero and which lies on the left side with respect to a position at which the light intensity takes a maximum value in the light intensity distribution AI3 formed by the measurement pattern 12B during stationary exposure, as shown in FIG. 5B. The third measurement unit 20E is located at a position at which the light intensity is nearly zero and which lies on the right side with respect to a position at which the light intensity takes a maximum value in the light intensity distribution AI3 formed by the measurement pattern 12C during stationary exposure, as shown in FIG. 5C.

The output results obtained by the first measurement unit 20C to third measurement unit 20E will be described here. Let I1(t) be the light intensity measured by the first measurement unit 20C. Similarly, let I2(t) and I3(t) be the light intensities measured by the second measurement unit 20D and third measurement unit 20E.

Figure 6:
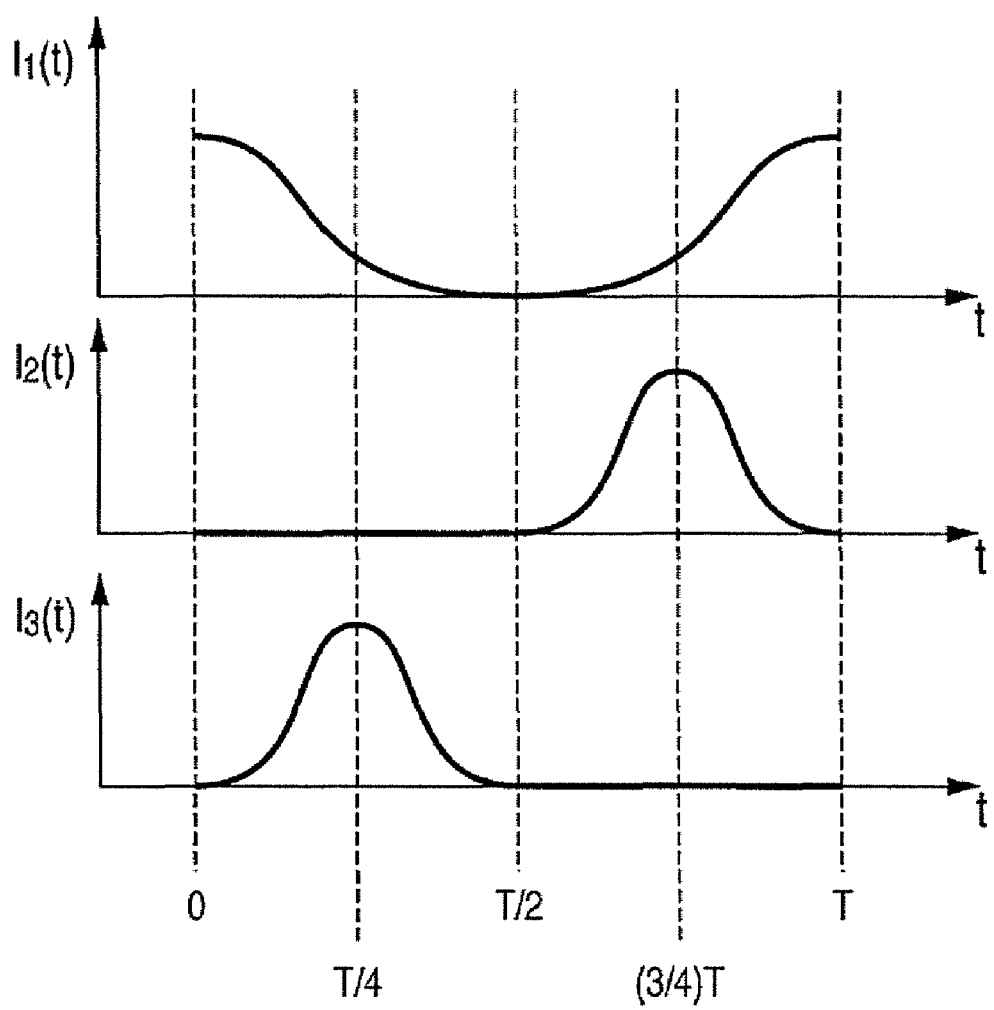
FIG. 6 is a graph showing an example of the light intensities measured by the three measurement units shown in FIGS. 5A to 5C.

Assume, for example, that the light intensity distributions AI2 and AI3 shift to the right from zero to p at a constant speed. Let T be the time until the light intensity distributions AI2 and AI3 shift from zero to p. The abscissa indicates a time t, and the ordinate indicates a measured light intensity I(t). The first measurement unit 20C to third measurement unit 20E measure light intensities I1(t) to I3(t) as shown in FIG. 6. FIG. 6 is a graph showing an example of the light intensities I1(t) to I3(t) measured by the first measurement unit 20C to third measurement unit 20E.

The light intensity I1(t) measured by the first measurement unit 20C will be described first. When the time t is zero, the light intensity I1(t) takes a maximum value. As the time t elapses, the light intensity I1(t) decreases. When the time t becomes T/2, the light intensity I1(t) becomes zero. After that, as the time t further elapses, the light intensity I1(t) increases. When the time t becomes T, the light intensity I1(t) takes a maximum value.

The light intensity I2(t) measured by the second measurement unit 20D will be described next. When the time t is T/2 or less, the light intensity I2(t) is zero. When the time t becomes T/2 or more, the light intensity I2(t) increases. When the time t becomes T×(3/4), the light intensity I2(t) takes a maximum value. When the time becomes T×(3/4) or more, the light intensity I2(t) decreases. When the time t becomes T, the light intensity I2(t) becomes zero.

The light intensity I3(t) measured by the third measurement unit 20E will be described last. When the time t is T/4 or less, the light intensity I3(t) increases. When the time t becomes T/4, the light intensity I3(t) takes a maximum value. When the time t becomes T/4 or more, the light intensity I3(t) decreases. When the time t becomes T/2 or more, the light intensity I3(t) becomes zero.

Figure 7:
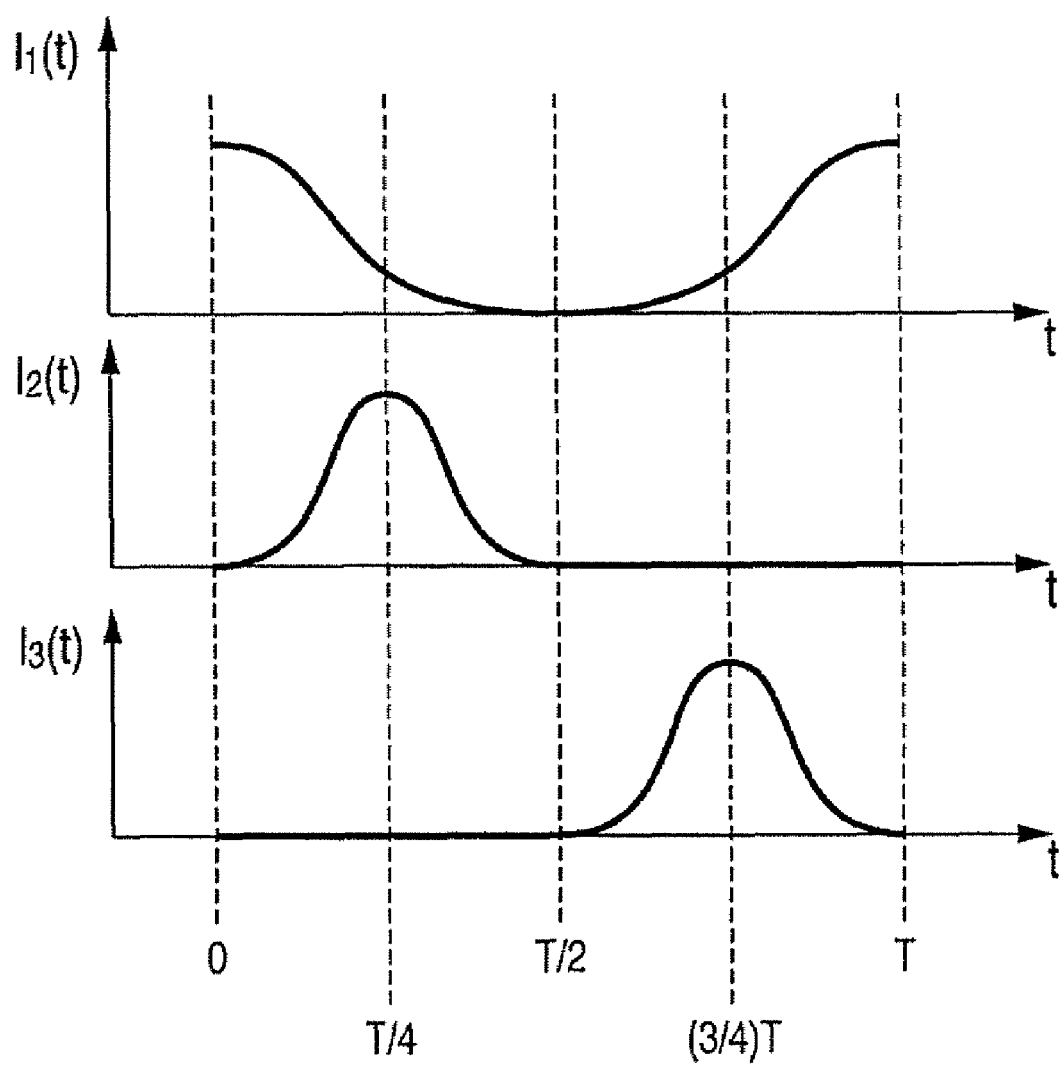
FIG. 7 is a graph showing another example of the light intensities measured by the three measurement units shown in FIGS. 5A to 5C.

If the light intensity distributions AI2 and AI3 shift to the left from zero to p at a constant speed, the first measurement unit 20C to third measurement unit 20E measure light intensities I1(t) to I3(t) as shown in FIG. 7. Note that FIG. 7 is a graph showing an example of the light intensities I1(t) to I3(t) measured by the first measurement unit 20C to third measurement unit 20E.

Referring to FIGS. 6 and 7, if a value dI1(t)/dt obtained by differentiating the light intensity I1(t) with respect to time has a negative sign, a change in light intensity I2(t) means that the light intensity distribution is shifted to the left. Similarly, if the value dI1(t)/dt obtained by differentiating the light intensity I1(t) with respect to time has a positive sign, a change in light intensity I3(t) means that the light intensity distribution is shifted to the left. If the value dI1(t)/dt obtained by differentiating the light intensity I1(t) with respect to time has a negative sign, a change in light intensity I3(t) means that the light intensity distribution is shifted to the right. Similarly, if the value dI1(t)/dt has a positive sign, a change in light intensity I2(t) means that the light intensity distribution is shifted to the right.

In this manner, analyzing the outputs from the first measurement unit 20C to third measurement unit 20E and their time changes makes it possible to measure scan distortions. In other words, differentiating a function describing the light intensity distribution AI2 with respect to time makes it possible to calculate the direction and amount of the synchronization shift between the reticle stage and the wafer stage.

Alignment calibration using the first measurement unit 20C to third measurement unit 20E will be explained. For the alignment calibration, the light intensity distribution AI2 of the measurement pattern 12A is formed while the first measurement mask 10A is at rest. The first measurement unit 20C is then aligned such that the light intensity measured by it takes a maximum value. In addition, the light intensity distribution AI3 of the measurement pattern 12B is formed while the second measurement mask 10B is at rest. The second measurement unit 20D and third measurement unit 20E are then aligned such that the sum or the sum of squares of the light intensities measured by them takes a minimum value.

Figure 8:
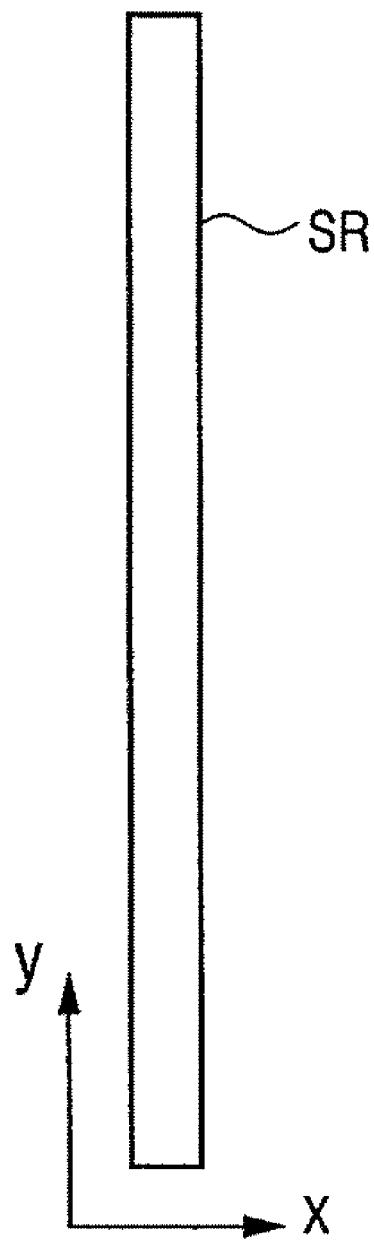
FIG. 8 is a view showing an example of an illumination region for illuminating a reticle in a scanning exposure apparatus.

In the exposure apparatus, since an aberration changes for each field angle, scan distortion also changes for each field angle. For this reason, it is necessary to prepare measurement masks 10 and measurement units 20 in correspondence with the respective field angles. In a scanning exposure apparatus, an illumination region SR for illuminating a reticle has a rectangular shape, as shown in FIG. 8. The longitudinal direction of the illumination region SR is defined as the y direction, and its widthwise direction is defined as the x direction. Note that FIG. 8 is a view showing an example of the illumination region SR for illuminating the reticle in the scanning exposure apparatus.

The scanning exposure apparatus continuously scans a reticle and wafer in the x direction to transfer the pattern of the reticle onto the wafer by exposure. At present, since the dimension of the illumination region SR in the x direction is as short as 2 mm or less, an aberration which depends on the field angle is less likely to change. In contrast, since the dimension of the illumination region SR in the y direction is as long as 26 mm, an aberration which depends on the field angle is more likely to change.

To cope with this situation, the illumination region SR is divided into several regions (e.g., 11 regions) such that its dimension in the y direction decreases, and the measurement mask 10 and measurement unit 20 are arranged in each region. This makes it possible to collectively measure the scan distortion for each field angle.

Figure 9A:
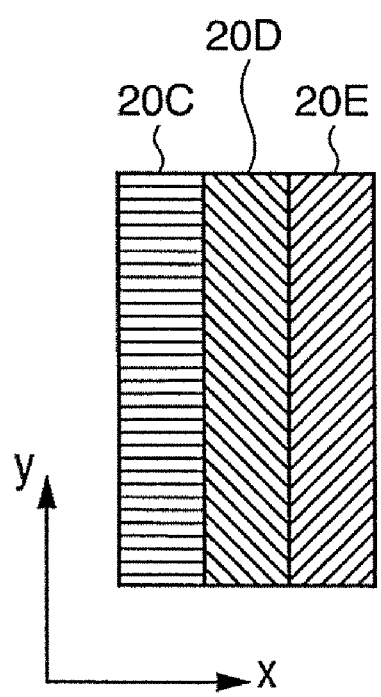
FIGS. 9A and 9B are views showing examples in which measurement units are arranged in correspondence with respective field angles.
Figure 9B:
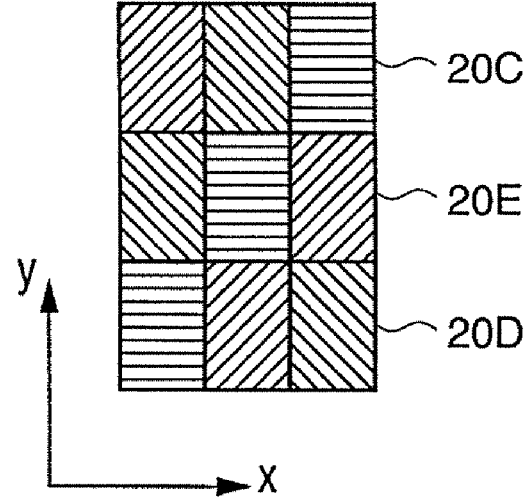

FIG. 9A shows an example in which the measurement units 20 (first measurement unit 20C to third measurement unit 20E) are arranged in correspondence with respective field angles. As shown in FIG. 9A, the first measurement unit 20C to third measurement unit 20E preferably have the same field angle. The arrangement of the measurement units 20 shown in FIG. 9A is merely an example, and the arrangement of the first measurement unit 20C to third measurement unit 20E in the x direction can be exchanged in random order. For example, as shown in FIG. 9B, the first measurement unit 20C to third measurement unit 20E may be arranged in a checkerboard pattern. In addition, the first measurement unit 20C to third measurement unit 20E may be grouped as one measurement unit. Note that FIGS. 9A and 9B are views showing examples in which the measurement units 20 are arranged in correspondence with respective field angles.

The measurement mask 10 will be explained in detail. To form a light intensity distribution having a sinusoidal waveform on a wafer surface, the period p of the measurement pattern 12 of the measurement mask 10 is set such that p/2 is normalized into a value less than 0.5 by ($\lambda$/NA). The period p of the measurement pattern 12 of the measurement mask 10 must be set such that p/2 is normalized into a value equal to or more than 0.25 by ($\lambda$/NA) by taking account of the resolution limit of the exposure apparatus. As the ratio (contrast)

between the maximum value and minimum value of the light intensity distribution increases, measurement can be performed with a higher accuracy. For this reason, the measurement mask 10 is preferably the so-called phase shifting mask.

The phase shifting mask means a mask in which adjacent light-transmitting portions on it have a phase difference of 180°. To give the phase difference to the adjacent light-transmitting portions, a member (phase shifter) which gives a phase difference is provided. FIG. 10 is a schematic sectional view showing the arrangement of a general phase shifting mask. As shown in FIG. 10, a phase shifting mask used for exposure has a light-shielding portion CR made of, for example, chromium on a substrate SI which is made of, for example, quartz and has transparency to exposure light. The exposure light passes through a region (light-transmitting portion) PR having no light-shielding portion CR. By repetitively forming the light-shielding portions CR and light-transmitting portions PR on the substrate SI, an L&S pattern is formed. As described above, adjacent light-transmitting portions PR on the phase shifting mask must have a phase difference of 180°. If the substrate SI has a refractive index n, an engraving (engraved portion) is formed so that the adjacent light-transmitting portions PR have a step of $(\lambda/2)/(n-1)$. This allows the adjacent light-transmitting portions to have a phase difference of 180°. Note that approximation was done assuming that the refractive index of the ambient air around the phase shifting mask is 1. If a phase shifting mask in which a phase difference is given to the adjacent light-transmitting portions PR by etching the substrate SI is used, the light transmittance of an etched portion is different from that of a non-etched portion in the light-transmitting portion PR. In general, the light transmittance of an engraved portion is lower than that of a non-engraved portion. This makes it necessary to, for example, increase the line width of the engraved portion or engrave the substrate into an overhang shape (i.e., engraving the substrate SI on the lower side of the light-shielding portion CR in small amounts).

Figure 11A:
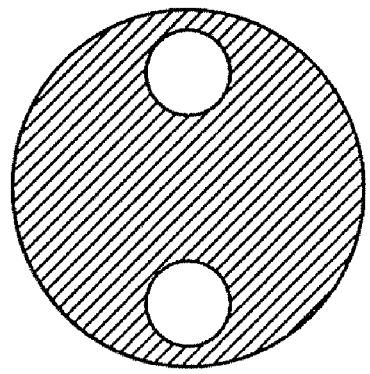
FIGS. 11A to 11C are views showing examples of oblique illumination.
Figure 11B:
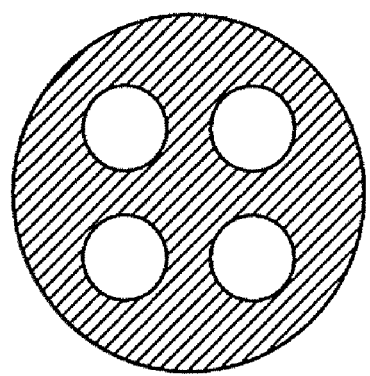
Figure 11C:
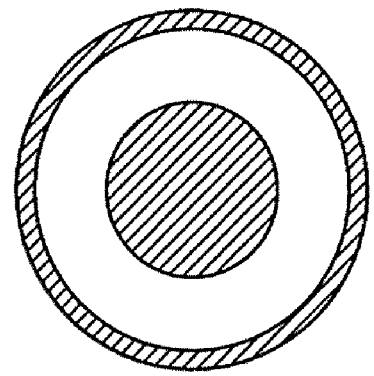

If a phase shifting mask is used as the measurement mask 10, it is preferably illuminated using the so-called low-σ illumination in which the central portion of an effective light source is relatively bright. If a binary mask (a mask having only a light-transmitting portion and light-shielding portion) is used as the measurement mask 10, it is preferably illuminated using oblique illumination. Examples of the oblique illumination are dipole illumination as shown in FIG. 11A, quadrupole illumination as shown in FIG. 11B, and annular illumination as shown in FIG. 11C. However, the oblique illumination is not limited to them. It is also possible to use an attenuated phase shifting mask as the measurement mask 10. The attenuated phase shifting mask means a mask obtained by replacing the light-shielding portion of the binary mask by a member which attenuates light and gives a phase difference of 180° to the light-transmitting portion. If the attenuated phase shifting mask is used as the measurement mask 10, the oblique-incidence illumination is effective as well. FIGS. 11A to 11C are views showing examples of the oblique-incidence illumination.

As described above, scan distortions occur in both the x and y directions of the illumination region SR shown in FIG. 8. The scan distortion in the x direction can be measured by using a measurement mask 10 on which L&S patterns are repetitively formed in the x direction, and a measurement unit 20 on which openings 22 are repetitively formed in the x direction. Similarly, the scan distortion in the y direction can be measured by using a measurement mask 10 on which L&S patterns are repetitively formed in the y direction, and a measurement unit 20 on which openings 22 are repetitively formed in the y direction. Scan distortions in the ±45° directions can be measured by using a measurement mask 10 on which L&S patterns are repetitively formed in the ±45° directions, and a measurement unit 20 on which openings 22 are repetitively formed in the ±45° directions.

To collectively measure the scan distortions in the x, y, and ±45° directions, L&S patterns repetitively formed in the x, y, and ±45° directions are made to coexist on the measurement pattern 12 of the measurement mask 10, and a measurement unit 20 corresponding to it is used. In this case, it is necessary to use an effective light source with a good symmetry. For example, if a phase shifting mask is used as the measurement mask 10, low-σ illumination is preferably used. If a binary mask or attenuated phase shifting mask is used as the measurement mask 10, annular illumination or the like is preferably used. This makes it possible to reduce the pattern dependency of the effective light source.

If the attenuated phase shifting mask is used as the measurement mask 10, a light intensity is sometimes observed at an undesirable position (sidelobe effect). To reduce the sidelobe effect, a minute light-transmitting portion is arranged at a position at which a sidelobe appears to cancel it.

Preferably, illumination light for illuminating the measurement mask 10 is polarized in a direction perpendicular to the repetition direction of the measurement pattern 12 and parallel to the mask surface (this polarization state is called S-polarization). This is because the S-polarization can increase the contrast of the light intensity distribution as compared with other polarization methods. If the measurement pattern 12 has only L&S patterns repetitively formed in one direction, the illumination light for illuminating the measurement mask 10 is S-polarized. If L&S patterns repetitively formed in the x, y, and ±45° directions coexist on the measurement pattern 12, the measurement mask 10 is preferably illuminated without polarization.

Second Embodiment

In the second embodiment, a contact hole pattern is used as a measurement pattern 12 of a measurement mask 10. The contact hole pattern is two-dimensionally formed on the measurement mask 10. An axis parallel to the mask surface is defined as the x-axis, an axis perpendicular to the x-axis and parallel to the mask surface is defined as the y-axis, and an axis perpendicular to the mask surface is defined as the z-axis. The period of the contact hole pattern in the x direction may be different from that in the y direction, and its center need not always be located on an intersection in an orthogonal grid pattern. However, the second embodiment assumes that the period of a contact hole pattern in the x direction is equal to that in the y direction, and its center is located on an intersection in an orthogonal grid pattern.

Figure 12A:
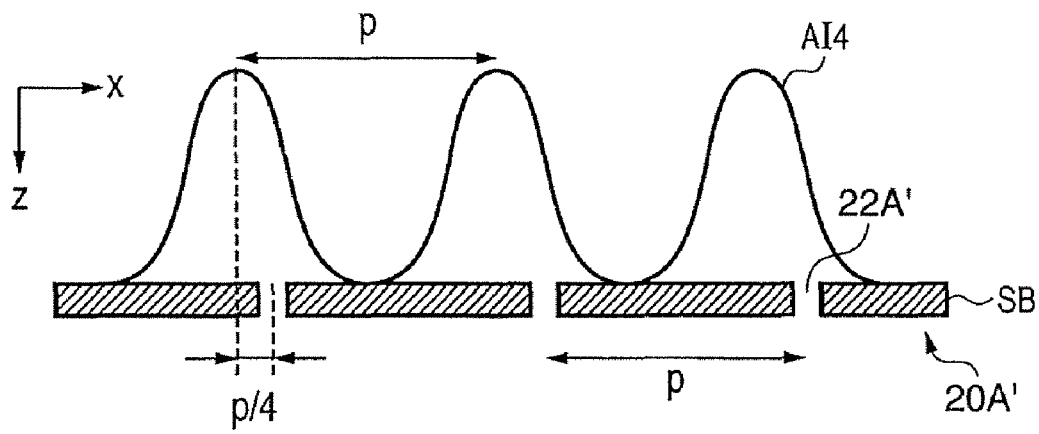
FIGS. 12A and 12B are charts each showing the relationship between a light intensity distribution formed by the measurement pattern of a measurement mask and an opening of a measurement unit.
Figure 12B:
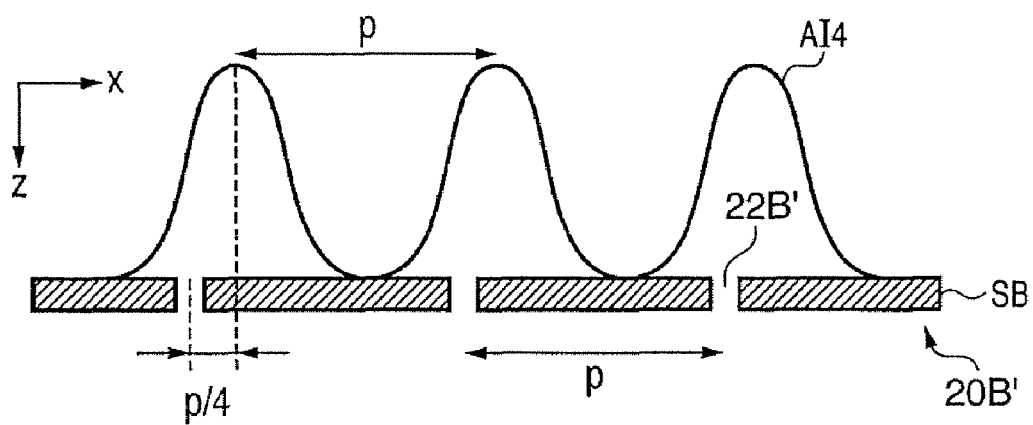

The measurement pattern (contact hole pattern) 12 of the measurement mask 10 in the second embodiment forms a light intensity distribution (aerial image) AI4 with a period p as shown in FIGS. 12A and 12B in a section x-z which passes through its maximum value. Two measurement units 20' are arranged for the light intensity distribution AI4 formed by the measurement pattern 12. The measurement units 20' each include a light-shielding board SB having openings 22' with the period p formed as minute pinholes, and a light intensity sensor 24 which includes a photodetector and is arranged under the openings 22'. The openings 221 are formed in the x direction. The two measurement units 20' will be referred to as a first measurement unit 20A' and second measurement unit 20B' hereinafter. Note that FIG. 12A is a chart showing the positional relationship between a light intensity distribution formed by the measurement pattern 12 of the measurement mask 10 and the first measurement unit 20A'. FIG. 12B is a chart showing the positional relationship between a light intensity distribution formed by the measurement pattern 12 of the measurement mask 10 and the second measurement unit 20B'.

As shown in FIG. 12A, the first measurement unit 20A' is arranged such that an opening 22A' is located at a position shifted to the left by p/4 from a position at which the light intensity takes a maximum value in the light intensity distribution AI4 formed by the measurement pattern 12 during stationary exposure.

As shown in FIG. 12B, the second measurement unit 20B' is arranged such that an opening 22B' is located at a position shifted to the left by p/4 from a position at which the light intensity takes a maximum value in the light intensity distribution AI4 formed by the measurement pattern 12 during stationary exposure. The diameters of the openings 22A' and 22B' of the first and second measurement units 20A' and 20B', which are formed as minute pinholes, are preferably p/4 or less.

In the second embodiment, since p/2 is normalized into a value less than 0.5 by ($\lambda$/NA), the light intensity distribution can be approximated assuming four-beam interference. The light intensity distribution AI4 on the image plane (i.e., the measurement unit 20') in four-beam interference can be approximated by a sine wave. The slope of the sine wave becomes maximum at a position shifted by ¼ the period from a position at which the light intensity takes a maximum value. Hence, the first measurement unit 20A' and second measurement unit 20B' are sensitive to a change in light intensity in response to a positional shift.

Consider a case in which the absolute value of the shift amount of the light intensity distribution AI4 is p/4 or less. If the light intensity distribution AI4 shifts in the positive direction of the x-axis, the light intensity measured by the first measurement unit 20A' increases while that measured by the second measurement unit 20B' decreases. If the light intensity distribution AI4 shifts in the negative direction of the x-axis, the light intensity measured by the first measurement unit 20A' decreases while that measured by the second measurement unit 20B' increases. Analyzing such a characteristic in the same manner as in the first embodiment makes it possible to measure a synchronization error (scan distortion) between a reticle stage and a wafer stage during scanning.

Alignment calibration using the first measurement unit 20A' and second measurement unit 20B' will be explained. For the alignment calibration, first, the light intensity distribution AI4 of the measurement pattern 12 is formed while the measurement mask 10 is at rest. The positions of the first measurement unit 20A' and second measurement unit 20B' in the x direction are then aligned such that the light intensities measured by them become equal to each other and take maximum values. To calibrate the relationship between the measured light intensity and the shift amount of the light intensity distribution AI4, the relationship between the position and the light intensity is acquired by moving the first measurement unit 20A' and second measurement unit 20B' in the x direction at least from −p/2 to p/2 during stationary exposure.

The measurement of the synchronization error (scan distortion) between the reticle stage and the wafer stage using three measurement units 20' and two measurement masks 10 each having a measurement pattern 12 formed as a contact hole pattern will be explained. In the following description, the two measurement masks 10 will be referred to as a first measurement mask 10A' and second measurement mask 10B', and the three measurement units 20' will be referred to as a first measurement unit 20C', second measurement unit 20D', and third measurement unit 20E'.

Figure 13A:
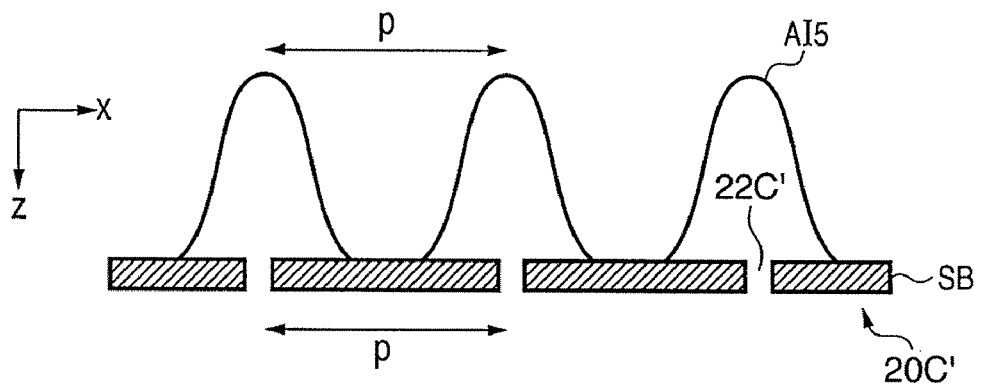
FIGS. 13A to 13C are charts each showing the relationship between a light intensity distribution formed by the measurement pattern of a measurement mask and an opening of a measurement unit.
Figure 13B:
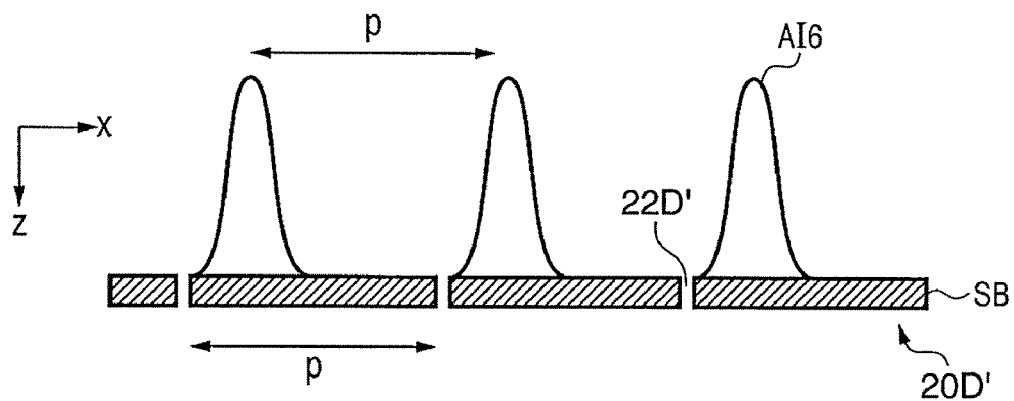
Figure 13C:
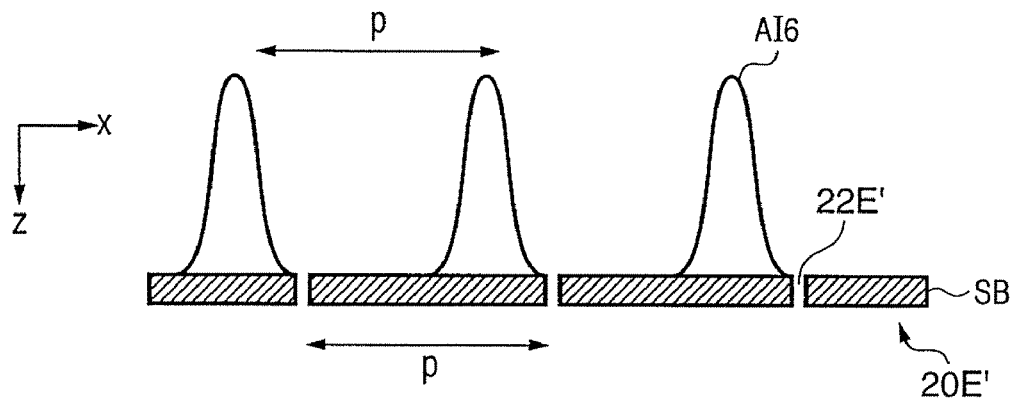

A measurement pattern 12A' of the first measurement mask 10A' is a contact hole pattern and forms a light intensity distribution AI5 with a period p, as shown in FIG. 13A. A measurement pattern 12B' of the second measurement mask 10B' is a contact hole pattern and forms a light intensity distribution AI6 in which the light intensity becomes nearly zero at p/2, as shown in FIG. 13B or 13C. Note that FIG. 13A is a chart showing the positional relationship between the light intensity distribution AI5 formed by the measurement pattern 12A' of the first measurement mask 10A' and an opening 22C' of the first measurement unit 20C'. FIG. 13B is a chart showing the positional relationship between the light intensity distribution AI6 formed by the measurement pattern 12B' of the second measurement mask 10B' and an opening 22D' of the second measurement unit 20D'. FIG. 13C is a chart showing the positional relationship between the light intensity distribution AI6 formed by the measurement pattern 12B' of the second measurement mask 10B' and an opening 22E' of the third measurement unit 20E'.

The first measurement unit 20C' to third measurement unit 20E' include light-shielding boards SB having, on their intersections in orthogonal square grids, the openings 22C' to 22E' with the period p formed as minute pinholes. The first measurement unit 20C' to third measurement unit 20E' also include light intensity sensors 24 which include photodetectors and are arranged under the openings 22C' to 22E'. The diameters of the openings 22C' to 22E' are preferably p/4 or less.

The first measurement unit 20C' is arranged such that the opening 22C' is located at a position at which the light intensity takes a maximum value in the light intensity distribution AI5 formed by the measurement pattern 12A' during stationary exposure, as shown in FIG. 13A. The second measurement unit 20D' is arranged such that the opening 22D' is located at a position at which the light intensity is nearly zero and which lies on the left side with respect to a position at which the light intensity takes a maximum value in the light intensity distribution AI6 formed by the measurement pattern 12B' during stationary exposure, as shown in FIG. 13B. The third measurement unit 20E' is located at a position at which the light intensity is nearly zero and which lies on the right side with respect to a position at which the light intensity takes a maximum value in the light intensity distribution AI6 formed by the measurement pattern 12C' during stationary exposure, as shown in FIG. 13C.

The output results obtained by the first measurement unit 20C' to third measurement unit 20E' will be described here. Let I1(t)' be the light intensity measured by the first measurement unit 20C'. Similarly, let I2(t)' and I3(t)' be the light intensities measured by the second measurement unit 20D' and third measurement unit 20E'.

As in the first embodiment, the positional shifts of the light intensity distributions and the light intensities I1(t)' to I3(t)' measured by the first measurement unit 20C' to third measurement unit 20E' have the following relationship. More specifically, if a value dI1(t)'/dt obtained by differentiating the light intensity I1(t)' measured by the first measurement unit 20C' with respect to time has a negative sign, a change in light intensity I2(t)' means that the light intensity distribution is shifted to the left. Similarly, if the value dI1(t)'/dt obtained by differentiating the light intensity I1(t)' measured by the first measurement unit 20C' with respect to time has a positive sign, a change in light intensity I3(t)' means that the light intensity distribution is shifted to the left. If the value dI1(t)'/dt obtained by differentiating the light intensity I1(t)' measured by the first measurement unit 20C' with respect to time has a negative sign, a change in light intensity I3(t)' means that the light intensity distribution is shifted to the right. Similarly, if the value dI1(t)/dt obtained by differentiating the light intensity I1(t)' measured by the first measurement unit 20C' with respect to time has a positive sign, a change in light intensity I2(t)' means that the light intensity distribution is shifted to the right.

In this manner, analyzing the outputs from the first measurement unit 20C' to third measurement unit 20E' and their time changes makes it possible to measure scan distortions.

To form a light intensity distribution having a sinusoidal waveform on a wafer surface, the period p of the measurement pattern (contact hole pattern) 12 of the measurement mask 10 is set such that p/2 is normalized into a value less than 0.5 by ($\lambda$/NA). The period p of the measurement pattern 12 of the measurement mask 10 must be set such that p/2 is normalized into a value equal to or more than 0.25 by ($\lambda$/NA) by taking account of the resolution limit of the exposure apparatus. As the ratio (contrast) between the maximum value and minimum value of the light intensity distribution increases, measurement can be performed with a higher accuracy. For this reason, the measurement mask 10 is preferably the so-called phase shifting mask. To further increase the contrast, the period p is preferably set such that p/2 is normalized into a value equal to or more than $0.25 \times \sqrt{2}$ by ($\lambda$/NA).

An exposure apparatus to which a measurement apparatus for executing a measurement method according to this embodiment is applied will be explained below. FIG. 14 is a schematic sectional view showing the arrangement of an exposure apparatus 300 according to one aspect of this embodiment. The exposure apparatus 300 is a scanning projection exposure apparatus which transfers the pattern of a reticle 320 onto a wafer 340 by exposure using a step-and-scan scheme. The exposure apparatus 300 includes an illumination apparatus 310, a reticle stage 325 which supports the reticle 320 and a measurement mask 10, a projection optical system 330, a wafer stage 345 which supports the wafer 340 and a measurement unit 20, and a control unit 350. In the exposure apparatus 300, the measurement mask 10, measurement unit 20, and control unit 350 constitute a measurement apparatus 1 for executing the measurement method according to this embodiment.

The illumination apparatus 310 illuminates the measurement mask 10 and the reticle 320 on which a circuit pattern to be transferred is formed, and comprises a light source unit 312 and illumination optical system 314.

The light source unit 312 uses, for example, an excimer laser as a light source. The excimer laser includes, for example, a KrF excimer laser having a wavelength of about 248 nm, and an ArF excimer laser having a wavelength of about 193 nm. However, the light source of the light source unit 312 is not particularly limited to the excimer laser, and may use, for example, the i-line of a mercury lamp having a wavelength of about 365 nm.

The illumination optical system 314 illuminates the reticle 320 and measurement mask 10, and includes, for example, a lens, mirror, optical integrator, phase plate, diffractive optical element, and stop. The illumination optical system 314 has a function of illuminating the reticle 320 and measurement mask 10 with an effective light source having a desired shape (i.e., dipole illumination, quadrupole illumination, or annular illumination as shown in FIGS. 11A to 11C).

The reticle 320 has a circuit pattern and is supported and driven by the reticle stage 325. Diffracted light generated by the reticle 320 is projected onto the wafer 340 via the projection optical system 330. Since the exposure apparatus 300 is of a scan type, it scans the reticle 320 and wafer 340 to transfer the pattern of the reticle 320 onto the wafer 340.

The reticle stage 325 supports the reticle 320 and measurement mask 10 and connects to a moving mechanism (not shown). The moving mechanism (not shown) includes, for example, a linear motor and drives the reticle stage 325 so as to move the reticle 320 and measurement mask 10.

The projection optical system 330 projects the pattern of the reticle 320 onto the wafer 340. The projection optical system 330 also has a function of projecting a measurement pattern 12 of the measurement mask 10 onto the measurement unit 20. The projection optical system 330 can be a dioptric system, catadioptric system, or catoptric system.

In this embodiment, the wafer 340 is used as the substrate. It is also possible to use other substrates such as a glass plate in place of the wafer 340. The wafer 340 is coated with a photoresist.

The wafer stage 345 supports the wafer 340 and measurement unit 20 and drives them using, for example, a linear motor.

The control unit 350 includes a CPU and memory and controls the operation of the exposure apparatus 300. In this embodiment, the control unit 350 calculates the synchronization error between the reticle stage 325 and the wafer stage 345 based on a time change in light intensity distribution, which is measured by the measurement unit 20. The control unit 350 corrects the magnification of the illumination optical system 314 based on the calculation result. This makes it possible to reduce scan distortion due to the synchronization error between the reticle stage 325 and the wafer stage 345. The control unit 350 can also adjust the synchronization between the reticle stage 325 and the wafer stage 345 based on the calculated synchronization error.

The measurement mask 10 and measurement unit 20 which constitute the measurement apparatus 1 for executing the measurement method according to this embodiment can take any form as described above, and a detailed description thereof (arrangement and measurement operation) will be omitted.

First, the exposure apparatus 300 measures the synchronization error between the reticle stage 325 and the wafer stage 345. The synchronization error between the reticle stage 325 and the wafer stage 345 is measured using the measurement mask 10 and measurement unit 20 which constitute the measurement apparatus 1, as described above. As the synchronization error between the reticle stage 325 and the wafer stage 345 is measured, the synchronization between the reticle stage 325 and the wafer stage 345 is adjusted based on the measurement result. This makes it possible to reduce scan distortion which occurs while scanning the reticle 320 and wafer 340.

The pattern of the reticle 320 is then transferred onto the wafer 340 by exposure. The illumination optical system 314 illuminates the reticle 320 with a light beam emitted by the light source unit 312. The projection optical system 330 images the light beam which reflects the pattern of the reticle 320 on the wafer 340. At this time, the reticle 320 and wafer 340 are scanned while reducing scan distortion because the synchronization between the reticle stage 325 and the wafer stage 345 is accurately adjusted, as described above. Hence, the exposure apparatus 300 has an excellent exposure performance so as to provide devices (e.g., a semiconductor device, an LCD device, an image sensing device (e.g., a CCD), and a thin-film magnetic head) with high throughput, high quality, and a good economical efficiency.

Figure 15:
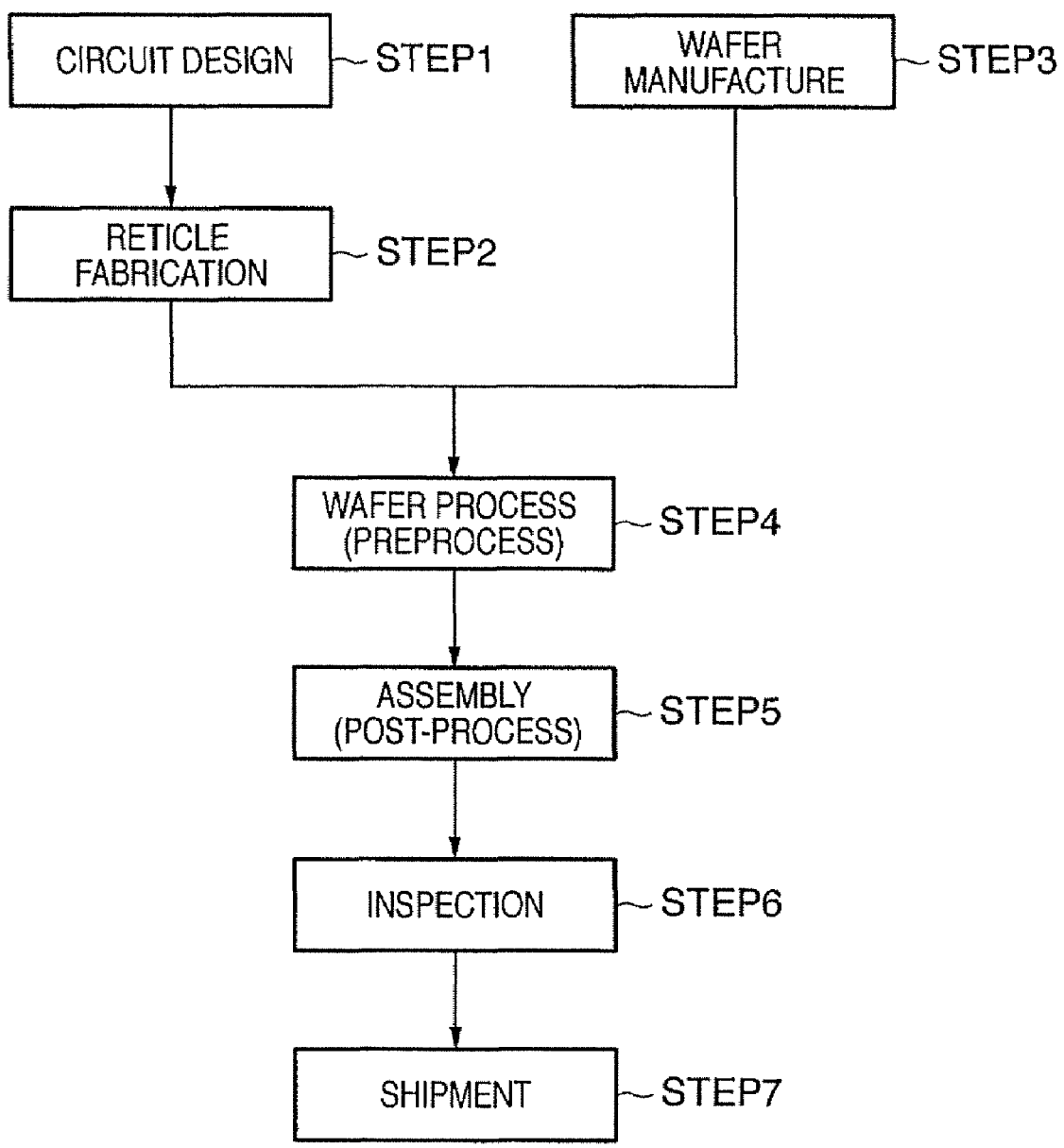
FIG. 15 is a flowchart for explaining a method for fabricating devices.
Figure 16:
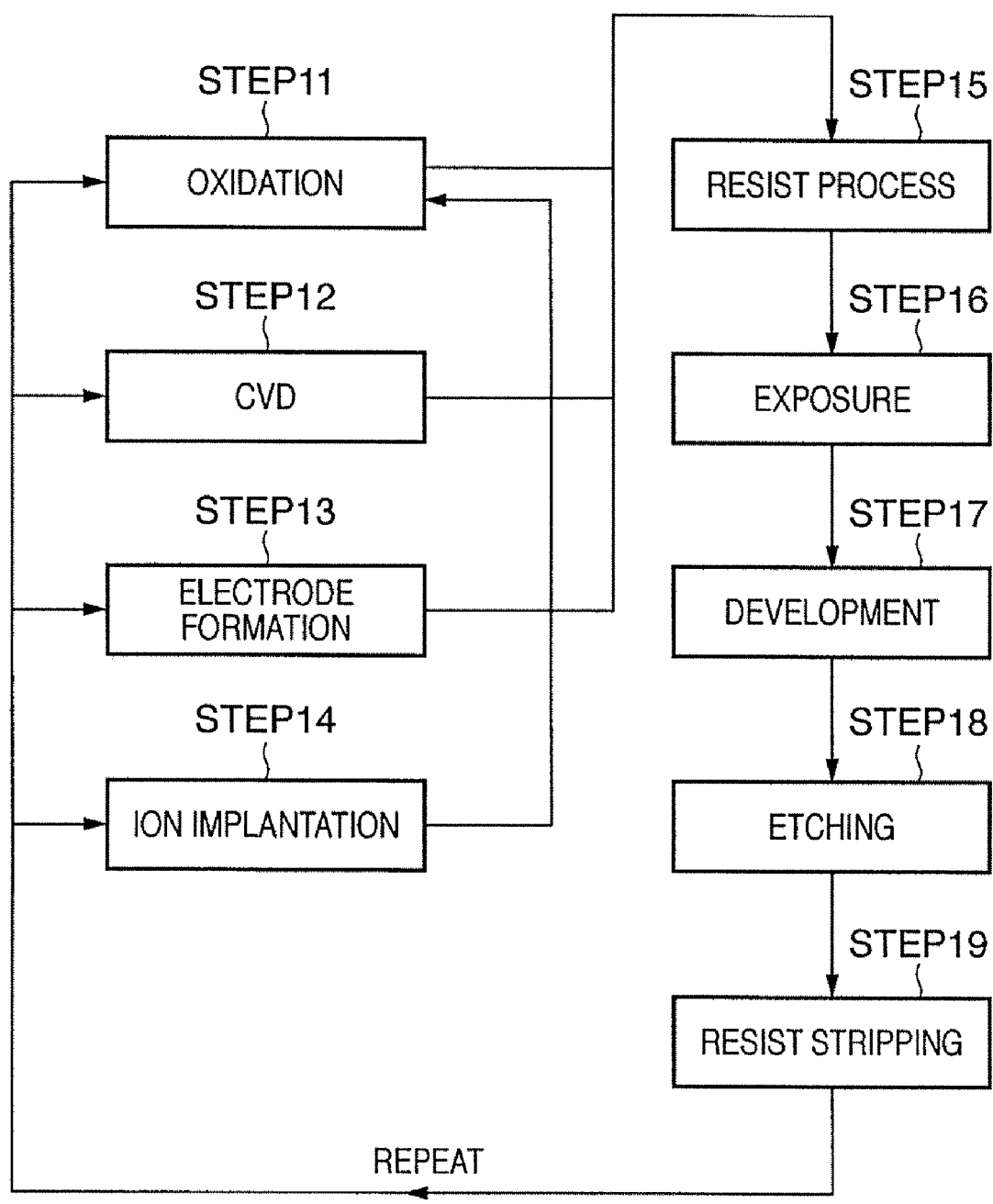
FIG. 16 is a detail flowchart of a wafer process in Step 4 of FIG. 15.

Referring now to FIGS. 15 and 16, a description will be given of an embodiment of a device fabrication method using the exposure apparatus 300. FIG. 15 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 16 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 300 to expose a circuit pattern from the mask onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device fabrication method of this embodiment may manufacture higher quality devices than the conventional one. Thus, the device fabrication method using the exposure apparatus 300, and resultant devices constitute one aspect of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese application No. 2007-005084 filed on Jan. 12, 2007, which is hereby incorporated by reference herein in its entirely.

What is claimed is:

1. A method for measuring a synchronization error between a first stage and a second stage in a scanning exposure apparatus including the first stage which supports a reticle, the second stage which supports a substrate, and a projection optical system which projects a pattern of the reticle onto the substrate, the method comprising the steps of:
   measuring, using a measurement unit, a light intensity distribution formed by a measurement pattern while synchronously scanning a measurement mask which has the measurement pattern and is arranged on the first stage, and the measurement unit arranged on the second stage; and
   calculating the synchronization error between the first stage and the second stage based on a time change in the light intensity distribution measured in the measuring step.

2. The method according to claim 1, wherein the measurement mask and the measurement unit are optically conjugate to each other via the projection optical system.

3. The method according to claim 1, wherein in the calculating step, a function describing the light intensity distribution is differentiated with respect to time to calculate a direction of synchronization shift between the first stage and the second stage is shifted.

4. The method according to claim 1, wherein in the calculating step, a function describing the light intensity distribution is differentiated with respect to time to calculate an amount of synchronization shift between the first stage and the second stage.

5. The method according to claim 1, wherein the measurement unit includes a light-shielding board in which an opening is formed, and a photoelectric conversion device configured to receive light having passed through the opening, and
   the measurement unit is arranged such that the opening is located at a position at which a light intensity takes a maximum value in a light intensity distribution formed by the measurement pattern while the measurement mask is at rest.

6. The method according to claim 1, wherein the measurement unit includes a light-shielding board in which an opening is formed, and a photoelectric conversion device configured to receive light having passed through the opening, and
   the measurement unit is arranged such that the opening is located at a position at which a light intensity becomes zero in a light intensity distribution formed by the measurement pattern while the measurement mask is at rest.

7. The method according to claim 1, wherein the measurement pattern includes a periodic pattern with a period p,
   the measurement unit includes a light-shielding board in which an opening is formed, and a photoelectric conversion device configured to receive light having passed through the opening, and
   the measurement unit is arranged such that the opening is located at a position shifted by p/4 from a position at which a light intensity takes a maximum value in a light intensity distribution formed by the measurement pattern while the measurement mask is at rest.

8. The method according to claim 5, wherein the opening is a slit or a pinhole.

9. The method according to claim 1, wherein
   the measurement pattern includes a periodic pattern with a period p, and
   p/2 is normalized into a value less than 0.5 by ($\lambda$/NA), where $\lambda$ is an exposure wavelength of the exposure apparatus, and NA is a numerical aperture of the projection optical system.

10. An exposure method for projecting a pattern of a reticle onto a substrate while scanning a first stage which supports the reticle and a second stage which supports the substrate, the method comprising the steps of:
    measuring the synchronization error using a measurement method according to claim 1;
    correcting the measured synchronization error; and
    projecting the pattern of the reticle onto the substrate while scanning the first stage and the second stage having undergone the correction of the synchronization error.

11. A device fabrication method comprising the steps of:
    exposing a substrate using an exposure method according to claim 10; and
    performing a development process for the exposed substrate.

12. A scanning exposure apparatus including a first stage which supports a reticle, a second stage which supports a substrate, and a projection optical system which projects a pattern of the reticle onto the substrate, the apparatus comprising:

a measurement mask which is arranged on the first stage and has a measurement pattern;

a measurement unit which is arranged on the second stage and configured to measure a light intensity distribution formed by the measurement pattern, while being scanned in synchronism with the measurement pattern; and a control unit configured to calculate a synchronization error between the first stage and the second stage based on a time change in the light intensity distribution measured by said measurement unit.

* * * * *